(12) United States Patent
Mandell et al.

(10) Patent No.: US 6,784,775 B2
(45) Date of Patent: Aug. 31, 2004

(54) PROXIMITY SAFETY SWITCH SUITABLE FOR USE IN A HAIR DRYER FOR DISABLING OPERATION

(75) Inventors: Joan Golden Mandell, West Hills, CA (US); Lee Jay Mandell, West Hills, CA (US); Richard David Mandell, Marina del Rey, CA (US)

(73) Assignee: LJM Associates, Inc., Canoga Park, CA (US)

( * ) Notice: Subject to any disclaimer, the term of this patent is extended or adjusted under 35 U.S.C. 154(b) by 0 days.

(21) Appl. No.: 10/376,434

(22) Filed: Feb. 28, 2003

(65) Prior Publication Data

US 2004/0040948 A1 Mar. 4, 2004

Related U.S. Application Data

(63) Continuation-in-part of application No. 10/230,749, filed on Aug. 29, 2002.
(60) Provisional application No. 60/249,996, filed on Nov. 29, 2002.

(51) Int. Cl.$^7$ ................................................ H01H 9/00
(52) U.S. Cl. ............................ 335/206; 34/96; 392/385
(58) Field of Search .............................. 335/205–207; 34/96; 392/385

(56) References Cited

U.S. PATENT DOCUMENTS

| | | |
|---|---|---|
| 3,622,922 A | 11/1971 | Mogio |
| 3,713,056 A | 1/1973 | Hosokawa |
| 4,130,955 A | 12/1978 | Baumgartner et al. |
| 4,198,557 A * | 4/1980 | Crowley ..................... 392/384 |
| 4,319,712 A | 3/1982 | Bar |
| 4,523,083 A | 6/1985 | Hamilton |
| 4,700,049 A * | 10/1987 | Rubin ........................ 392/381 |
| 4,751,485 A | 6/1988 | Fujio et al. |
| 4,914,376 A | 4/1990 | Meyer |
| 5,438,763 A | 8/1995 | Yang |
| 5,841,356 A | 11/1998 | Woodruff et al. |
| RE36,995 E | 12/2000 | Andis |
| 6,188,837 B1 * | 2/2001 | Kwan ........................ 392/385 |
| 6,205,674 B1 * | 3/2001 | Kaizuka ....................... 34/96 |
| 6,393,718 B1 * | 5/2002 | Harris et al. .................. 34/96 |

FOREIGN PATENT DOCUMENTS

WO     WO 82/03520 A1    10/1982

* cited by examiner

*Primary Examiner*—Lincoln Donovan
*Assistant Examiner*—Bernard Rojas
(74) *Attorney, Agent, or Firm*—Lee J. Mandell (57) ABSTRACT

A safety switch apparatus for disabling the operation of a hand-held appliance, e.g., a hair dryer, during periods of nonuse such as when the appliance is put down on a prescribed surface or placed in a non-functional position such as being held under a user's arm. In a first implementation, a sensor is coupled to control circuitry within the appliance to remove power from portions of the device, e.g., its motor and/or heater, when the appliance is proximate to an externally-provided magnetic field preferably provided from a magnetic element typically contained within a pad placeable on a work surface, within the work surface, or a wearable piece of clothing. In a second implementation, the converse occurs, i.e., a sensor is used to sense the presence of a user and to disable operation when the user is no longer present.

19 Claims, 6 Drawing Sheets

PROXIMITY SAFETY SWITCH SUITABLE FOR USE IN A HAIR DRYER FOR DISABLING OPERATION

The present application is a continuation-in-part of U.S. patent application Ser. No. 10/230,749, filed Aug. 29, 2002, and claims the benefit of U.S. Provisional Application No. 60/249,996, filed Nov. 29, 2002, each entitled "Proximity Safety Switch Suitable For Use In A Hair Dryer For Disabling Operation".

FIELD OF THE INVENTION

The present invention is generally directed to a safety switch apparatus for disabling the operation of a hand-held appliance, e.g., a hair dryer, during detected periods of non-use, e.g., when the appliance is put down, when the appliance is held in a non-functional position, etc.

BACKGROUND OF THE INVENTION

Since the introduction of the hand-held hair dryer many features have been added to expand the utility of the product and improve its function. Typically, hair dryers now have ground fault interrupters (GFIs) on their power plugs for safety and may have shut offs for when they overheat. Multiple speeds and heat settings are now included on most models and some have a special one-touch cold setting. Numerous attachments have been added such as diffusers and cones to focus the heat as well as to add volume. Also many dryers now come in decorator colors with retractable cords and wall mountings. For real aficionados, there are also quiet dryers and ionic dryers for quicker drying. All of these features have made drying one's hair safer, easier, and more efficient.

However, for anyone who has ever used a hand-held hair dryer, the real problem is how to shift from a first mode of preparing the hair for receiving heat to a second mode of delivering heat to the hair, with only two hands. The usual scenario is to turn off the dryer and put it down. Then, with one hand holding the brush, the other hand is used to wrap the intended section of hair around the brush in readiness to receive the heat. Once that is completed, while holding the brush in one hand, one must then pick up the dryer with the free hand and with that same hand that is used to hold the dryer to somehow move one's fingers nimbly around the dryer to flip the power switch to again turn on the dryer. Once that section of hair is satisfactorily dry, the process begins again. For women with anything other than very short hair and especially those who are trying to use the dryer to straighten hair this is an arduous, often exhausting process. For older people, especially those with beginning or moderate forms of arthritis, it is almost impossible to navigate the use of a hand-held hair dryer in any effective way. If one puts the dryer down on the counter without turning it off first, it typically will, within seconds, begin to move around wildly, at best blowing items around on the counter and at worst, falling off the counter onto the floor. At many beauty salons, the stylist often holds the activated dryer under his/her arm pit which can result in the air blowing into the face of the adjoining client. The only product known to the inventors of the present invention to even partially address this problem comprises a hair dryer with a wall mounted bracket that contains a mechanical power switch that removes power from the hair dryer when the hair dryer is mechanically snapped into the bracket.

SUMMARY OF THE INVENTION

The present invention is directed to a safety switch apparatus for disabling the operation of a hand-held appliance, e.g., a hair dryer, during periods of nonuse such as when the appliance is put down on a prescribed surface or placed in a non-functional position such as when it is held under a user's arm.

In a first class of preferred embodiments, a sensor, e.g., a hall effect sensor, a magnetoresistive sensor, a reed switch, or the like is coupled to control circuitry within the appliance to remove power from portions of the device, e.g., its motor and/or heater, when the appliance is proximate to an externally-provided magnetic field preferably provided from a magnetic element typically contained within a pad placeable on a work surface, e.g., a counter top.

In accordance with the first class of preferred embodiments suitable for use with a hand-held hair dryer wherein the hair dryer comprises a motor and a heater, a safety system comprises (1) a sensor for detecting the presence of an externally-provided magnetic field, e.g., a hall effect sensor, a magnetoresistive sensor, and a reed switch or the like; and (2) control and switch circuitry for alternatively supplying or removing power to/from the motor and/or heater; wherein the sensor is coupled to the control circuitry and in response to a detected magnetic field, the control and switch circuitry removes power from the motor and/or heater.

In a significant aspect of the first class of preferred embodiments, the control and switch circuitry supplies power to the motor and/or heater in response to the absence of a magnetic field. Additionally, preferred embodiments remove power from the control circuitry after a magnetic field is detected for a prescribed period.

In a further aspect of the first class of preferred embodiments, the externally-provided magnetic field is supplied from a planar member suitable for placement on a work surface. Typically, the planar member is a conventional "refrigerator magnet" and is preferably contained with a multilayer structure having soft and/or elastic outer layers similar to a conventional "mouse pad".

In a still further aspect of the first class of preferred embodiments, the externally-provided magnetic field may alternatively be provided by a magnetic element built into a work surface or contained within a wearable piece of clothing.

In an alternative implementation of the first class of preferred embodiments of the present invention, the sensor may be a tuned circuit which is sensitive to the proximity of a metallic, e.g., ferrous, element and the metallic element is located in an externally-provided planar member, a work surface or within an article of clothing.

In a second class of preferred embodiments, a sensor, e.g., a membrane switch, a hall effect sensor, a magnetoresistive sensor, and a reed switch or the like, is used to enable operation of the hand-held appliance when the sensor detects the presence, preferably in an operational mode, of the user. For example, the sensor, e.g., a membrane switch, may be located in a hand grip of the device and the power may only be provided to the motor and/or heater when the membrane hand switch is activated, e.g., when the hand grip is held by the user. In this second class of preferred embodiments, power is removed from portions of the device, e.g., its motor and/or heater, when the device is put down, i.e., placed in a non-operational mode, since, in that position, the membrane hand switch is no longer activated.

In accordance with the second class of preferred embodiments suitable for use with a hand-held hair dryer wherein the hair dryer comprises a motor and a heater, a safety system comprises (1) a sensor for detecting presence of a user, e.g., a membrane switch, a hall effect sensor, a magnetoresistive sensor, and a reed switch or the like; and (2) control and switch circuitry for alternatively supplying or removing power to/from the motor and/or heater; wherein the sensor is coupled to the control circuitry and in response to failing to detect a user, the control and switch circuitry removes power from the motor and/or heater.

In a significant aspect of the second class of preferred embodiments, the control and switch circuitry supplies power to the motor and/or heater in response to the presence of a user, e.g., in response to a user-supplied magnetic field. Additionally, preferred embodiments remove power from the control circuitry after the sensor fails to detect the user, e.g., a user-supplied magnetic field, for a prescribed period.

In a further aspect of the second class of preferred embodiment, the externally-provided magnetic field is supplied from a hand-wearable magnetic member, preferably within a ring or the like.

The novel features of the invention are set forth with particularity in the appended claims. The invention will be best understood from the following description when read in conjunction with the accompanying drawings.

DETAILED DESCRIPTION OF THE PREFERRED EMBODIMENT

The following description is of the best mode presently contemplated for carrying out the invention. This description is not to be taken in a limiting sense, but is made merely for the purpose of describing the general principles of the invention. The scope of the invention should be determined with reference to the claims.

The present invention is directed to a safety switch apparatus for disabling the operation of a hand-held appliance, e.g., a hair dryer, during periods of nonuse such as when the appliance is put down on a prescribed surface or placed in a non-functional position such as when it is held under a user's arm. In a first class of preferred embodiments, a sensor, e.g., a hall effect sensor, a magnetoresistive sensor, a reed switch, or the like, is coupled to control circuitry within the appliance to remove power from portions of the device, e.g., its motor and/or heater, when the appliance is proximate to an externally-provided magnetic field preferably provided from a magnetic element typically contained within a pad placeable on a work surface (for example a counter top), a magnet contained within the work surface, or a wearable piece of clothing.

Figure 1:
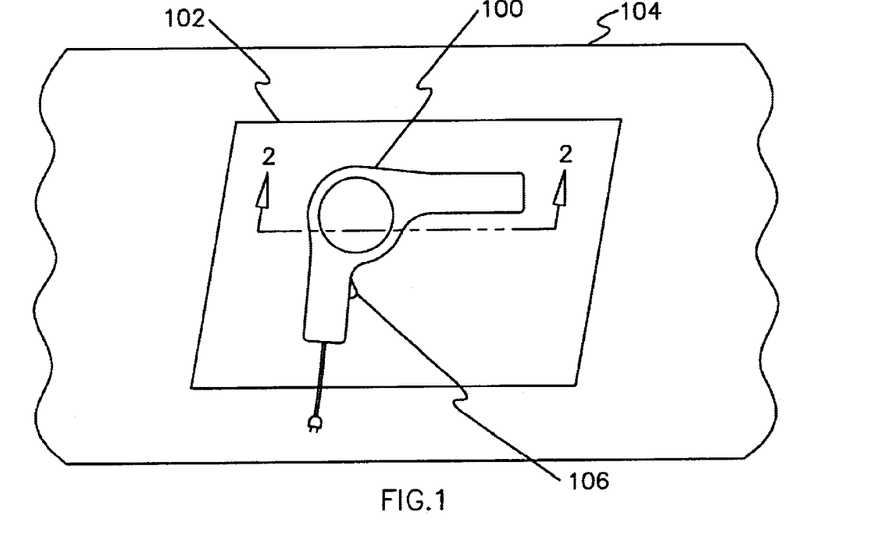
FIG. 1 is a perspective view of a hair dryer which contains an exemplary switch apparatus of the present invention positioned on a detectable pad on a work surface, e.g., a counter top.
Figure 5:
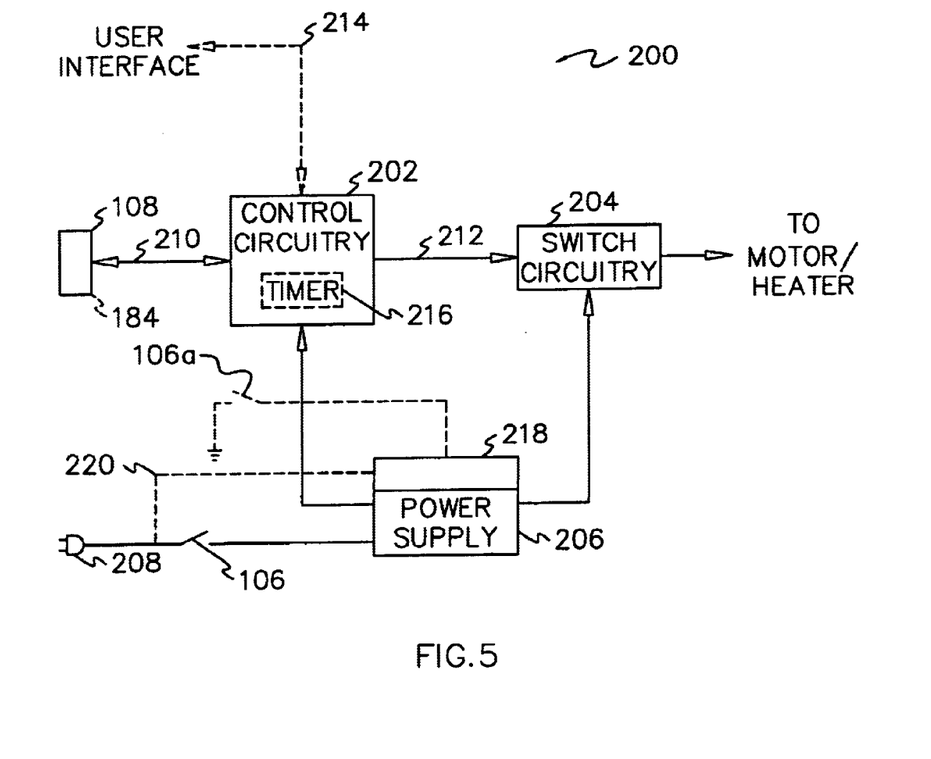
FIG. 5 is a block diagram of the safety switch apparatus of the present invention for removing/restoring power from/to a hand-held apparatus, e.g., a hair dryer, in response to a detected material.

FIG. 1 shows an exemplary hand-held appliance, e.g., hair dryer 100, containing the safety switch apparatus 200 of the present invention (see FIG. 5). Hair dryer 100 is shown located on a pad 102 on top of a work surface 104, e.g., a counter top. In a conventional operation, a hair dryer is typically activated using one or more on/off switches, used to control the fan motor speed and heater heat level. In the first class of preferred embodiments of the present invention, this operation is altered such that once the hair dryer 100 is activated using on/off switch 106, safety switch apparatus 200 disables power to the motor and/or heater once it senses proximity of the pad 102 to the dryer 100. Preferably as described further below, the power to the motor and/or heater is re-enabled if the dryer 100 is removed from the pad 102. However, if the dryer remains on the pad 102 for more than a prescribed length of time, e.g., 5 minutes, the safety switch apparatus 200 removes its own power. Afterwards, the operational cycle will only restart if the on/off switch 106 is again activated.

Figure 2:
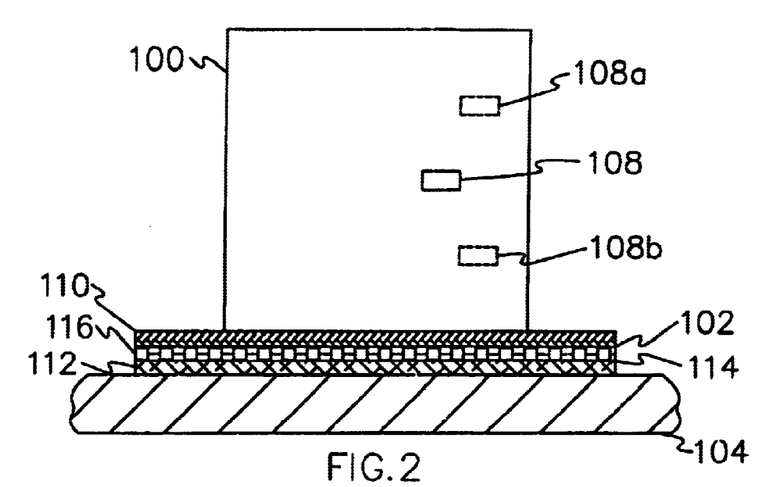
FIG. 2 is a cross sectional view of the dryer of FIG. 1 showing the switch of the present invention.

FIG. 2 shows a cross sectional view of that shown in FIG. 1 which additionally shows an exemplary construction of pad 102 and a sensor 108 which is positioned within the dryer 100 to sense the presence of detectable material within the pad 102. The pad 102 is preferably constructed as multiple planar outer layers, e.g., top layer 110 and bottom layer 112, which surround an inner planar layer 114 of detectable material 116. Preferably, the pad 102 and accordingly each layer 110, 112, 114 is pliable and the outer layers 110, 114 are soft and resilient so as to not harm either the work surface 104 or the dryer 100 with which it makes contact. Optionally, the top layer 110 is imprinted with an aesthetically pleasing pattern or color. Accordingly, pad 102 resembles a conventional "mouse pad".

In a first embodiment of the first class of preferred embodiments, the sensor 108 is a magnetic sensor, e.g., a hall effect sensor, a magnetoresistive sensor (including a giant magnetoresistive sensor), a reed switch, or the like, and the detectable material that forms the inner planar layer 114 is a magnetic material similar to that used in a "refrigerator magnet". Alternatively in a second embodiment of the first class of preferred embodiments, the sensor 108 may be implemented as a tuned circuit, e.g., an oscillator similar to that found in a stud sensor, a traffic sensor, a metal detector or the like, whose frequency alters with the presence of a metallic material, e.g., a ferrous material. Accordingly in this second embodiment, the detectable material that forms the inner planar layer 114 is such a metallic or ferrous material.

In the cross sectional view of FIG. 2, the sensor 108 is shown centrally located within the dryer 100 so that when the dryer 100 is set down on the pad 102, its separation from the inner planar layer 114 is essentially independent of whether the right or left side of the dryer 100 is placed downward toward the pad 100. Alternatively, sensor 108 may instead be formed from multiple sensors, e.g., sensors 108a or 108b, to further minimize separation of the sensor 108 from the inner planar layer 114 and thus increase its detection capability. Finally, if the sensitivity of the sensor 108 is sufficient and/or if the quantity of detectable material is increased, e.g., to increase the magnitude of the magnetic field, a single sensor may be used in positions corresponding to 108a, 108, 108b or anywhere in-between.

Figure 3:
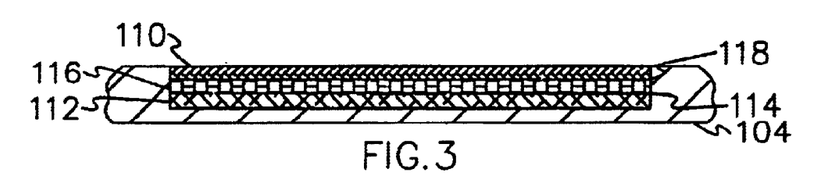
FIG. 3 is a cross sectional view of a work surface having a pad formed within a cutout on its upper surface.
Figure 4:
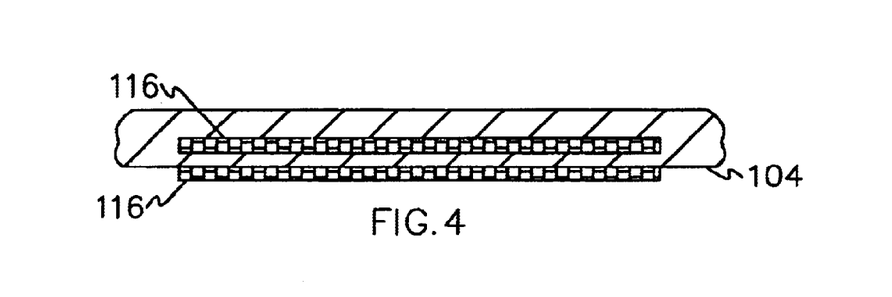
FIG. 4 is a cross sectional view of a work surface having detectable material contained within or below the surface.

While the movable, i.e., relocatable, configuration of FIG. 2 is presently preferred, FIGS. 3 and 4 show alternative techniques for presenting detectable material 116. Characteristic of these embodiments, is that the fixed location permits the use of larger amounts of detectable material which increases the detection capability of embodiments of the present invention. In FIG. 3, a cutout 118 is formed in the work surface 104 and a pad structure, similar to that described in relation to FIG. 2, is located within. Alternatively in FIG. 4, detectable material 116 may be formed within or beneath the work surface 104.

Preferably, pad 102 is flexible and thus it may be formed as a wearable piece of clothing, e.g., which can be held proximate to the user's arm pit, lap, etc., such that the user can disable operation of the dryer 100 just by placing the dryer 100 proximate to the wearable piece of clothing.

Figure 7:
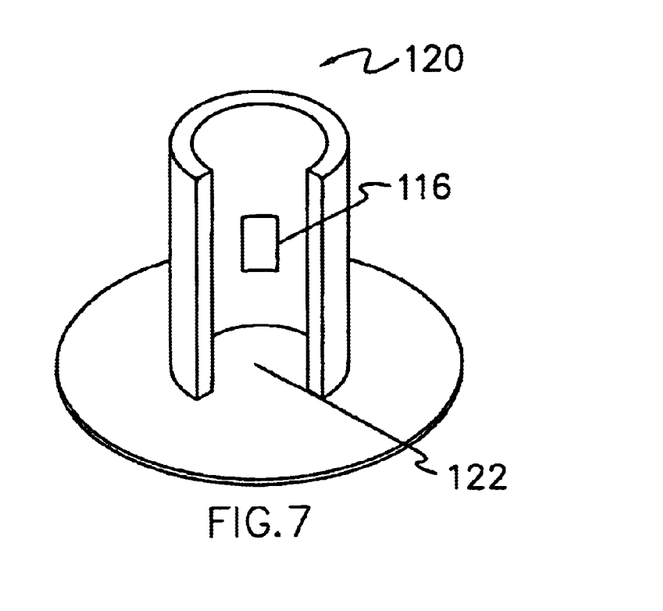
FIG. 7 is a simplified diagram of a holder for receiving and maintaining the hand-held apparatus, e.g., a hair dryer, and disabling or maintaining its operation, preferably dependent upon its relative position.

Furthermore, the detectable, e.g., magnetic, material 116 may be placed within a holder 120 (see FIG. 7), e.g., in an upright position, such that placing the dryer within the holder 120 may be detected to thus disable operation of the dryer 100. Alternatively, the holder 120 could be used without the detectable, e.g., magnetic, material and thus it would permit operation of the dryer 100 while it was in an upright, but not being user held, position. Finally, the holder 120 could be configured with the detectable, e.g., magnetic, material 116 in a limited portion or portions of the holder 120 such that in one, e.g., rotational, position, the dryer 100 would be disabled, while in a second, e.g., rotational, position, the dryer 100 would be enabled, e.g., when the sensor 108 approaches a cutout 122 in the holder 120.

Figure 6:
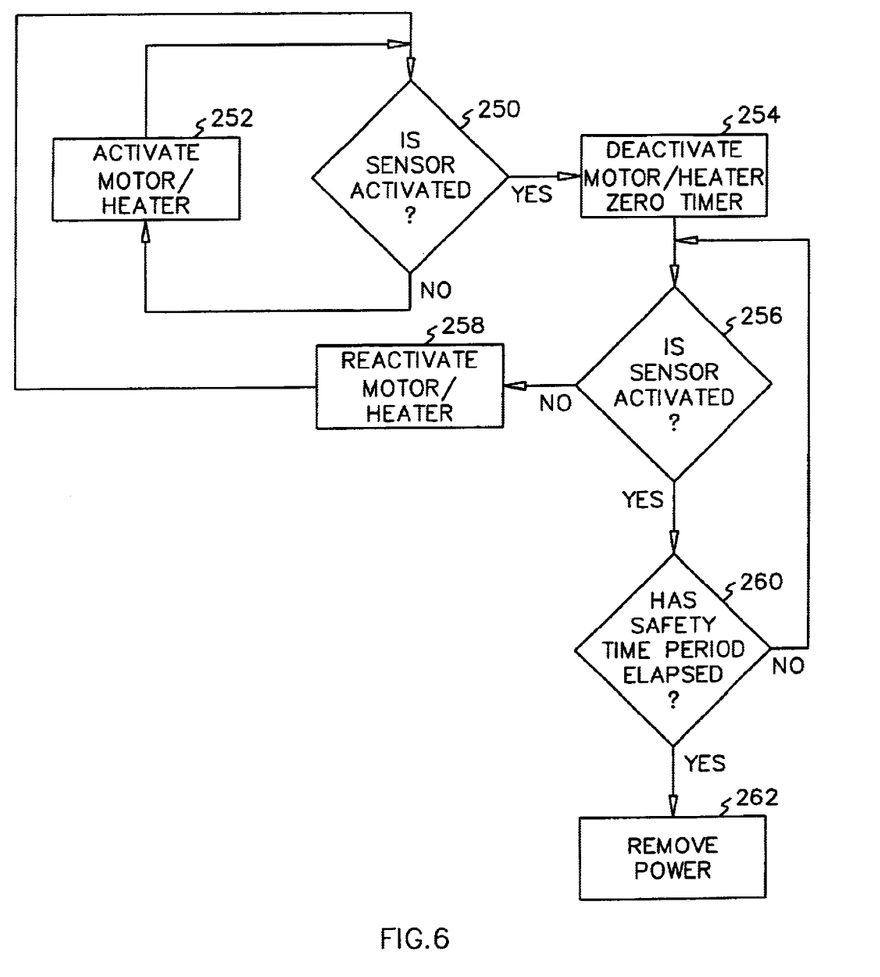
FIG. 6 is a simplified exemplary flow chart of the operation of the safety switch apparatus of the present invention for a first class of embodiments.

FIG. 5 shows a simplified exemplary block diagram of the safety switch apparatus 200 of the present invention. The safety switch apparatus 200 is primarily comprised of sensor 108, control circuitry 202, switch circuitry 204, power supply 206, and on/off switch 106. In operation, power is received from AC power plug 208 and once on/off switch 106 is activated, power supply 206 is activated which in turn supplies power to control circuitry 202 (and sensor 108 when an active sensor, e.g., a hall effect sensor, is used) and switch circuitry 204. Control circuitry 202, preferably a microcontroller, FPGA, a custom IC, or the like, preferably operates according to the exemplary flow chart of FIG. 6. Initially as noted in block 250, control circuitry 202 queries sensor 108 via line 210 for the presence of the detectable material 116, e.g., a magnetic material. If the detectable material 116 is not sensed, block 252 is executed and control line 212 is enabled to cause switch circuitry 204, typically a semiconductor switch, e.g., a silicon controlled rectifier (SCR), a mechanical relay, e.g., a contactor, or the like, to provide operating power, typically AC, to the motor and/or heater of the dryer 100. When the dryer 100 is positioned proximate to the detectable material 116, e.g., contained within pad 102, the sensor 108 is activated and in response, control circuitry 202 disables control line 212 in block 254 causing the switch circuitry 204 to remove power from the motor and/or heater (optionally, this determination of whether the motor and/or the heater are involved is made via optional user interface 214). Preferably, the disabling and enabling of the control line 212 is essentially concurrent with the detection and loss of detection of the detectable material. Accordingly, it is preferable that this response occur promptly, i.e., within a time period of 5 seconds of the detection status change. More preferably, this response occurs immediately, i.e., within a time period of 1 second or less following detection of the detectable material, even more preferably 0.5 seconds or less and most preferably 0.25 seconds or less. Optionally, a timer 216, preferably within the control circuitry 202, is zeroed at this step. Preferably in block 256, the control circuitry 202 continues to monitor the continued presence of the detectable material 116. Should the sensor 108 no longer be activated, the motor and/or heater is re-activated in block 258 by re-enabling the switch circuitry 204 via control line 212. Optionally, if sensor 108 continues to be activated, block 260 is executed and the timer 216 is compared to a prescribed safety time period, e.g., 5 minutes (optionally, programmable, e.g., to 15 seconds, 30 seconds, 1 minute, 5 minutes, via user interface 214). If the timer 216 has not reached the prescribed limit, the process loops back to block 256. When the prescribed limit is reached, block 262 is executed and power is removed from the control 202 and switch 204 circuitry as well. To enable this optional mode of operation, power supply 206 additionally comprises power maintenance circuitry 218, e.g., a relay or other circuitry, to maintain its power via line 220 upon momentary activation of on/off switch 106a. However, once block 262 is executed, this power maintenance circuitry 218 is deactivated. Optionally, the on/off switch 106 is disabled when the detectable material 116 is detected, i.e., unless the dryer 100 is removed from the pad 102 or the work surface 104 (which contains the detectable material).

Figure 8:
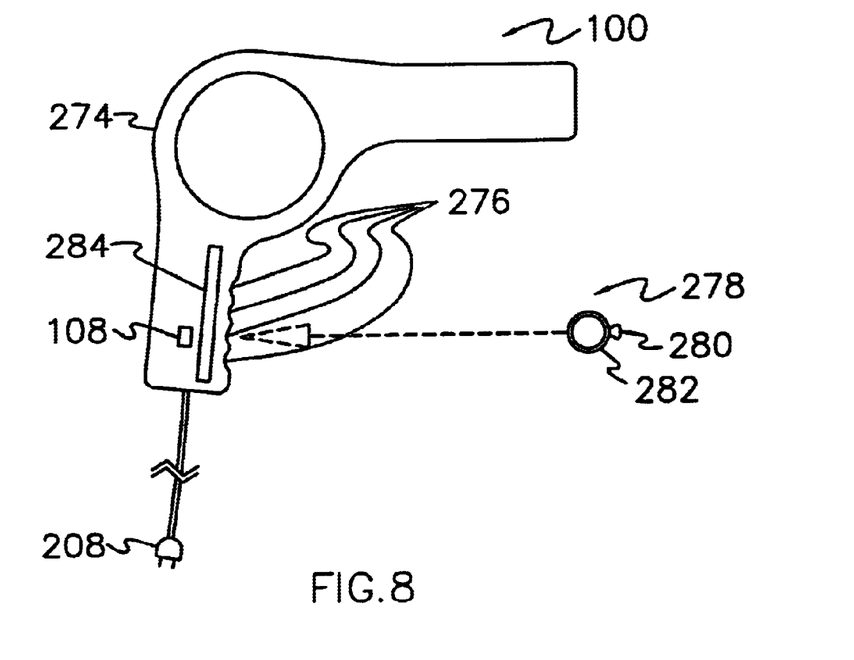
FIG. 8 is a simplified transparent view of a second class of hair dryers that is configured to remove power from its motor and/or heater when it no longer senses a user embracing its handle.

In a second class of embodiments, operation of the hand-held appliance, e.g., dryer 100, is only enabled when the device is being held by the user. In a first embodiment of this second class of embodiments, sensor 108, e.g., a hall effect sensor, a magnetoresistive sensor (including a giant magnetoresistive sensor), a reed switch, or the like is preferably positioned within a handle 274 of the dryer 100 (see FIG. 8), preferably proximate to a finger grip area 276. In this first embodiment, the user is provided a ring-type structure 278 with a magnetic member 280 embedded within. Preferably, the ring-type structure 278 has a band 282 which is preferably elastic or otherwise adjustable to accommodate a diverse population of users. Whenever the user's hand with the ring-type structure 278 on one of the user's fingers embraces the handle 274 of the dryer 100, the sensor 108 detects the magnetic field from the magnetic member 280 and thereby detects the presence of the user and accordingly enables the heater and/or blower of the dryer 100.

In a second embodiment of this second class of embodiments, a membrane switch 284 (see, for example, FIG. 8) is located within the handle 274 and depression of one or more positions on the membrane switch (preferably distributed within the finger grip area 276 of the handle 274) by the user signifies the presence of the user and thus may be used to activate the heater and/or blower of the dryer 100. Membrane switches are well known in the art. Typically, a membrane switch is comprised of a laminated package of two non-conductive, typically Mylar® or the like, flexible layers with potentially intersecting layers of conductive etch separated by a non-conductive separator layer with holes positioned such that depressing the laminate causes portions of the two "isolated" conductive etches to make contact through the hole or holes in the separator layer.

Figure 9:
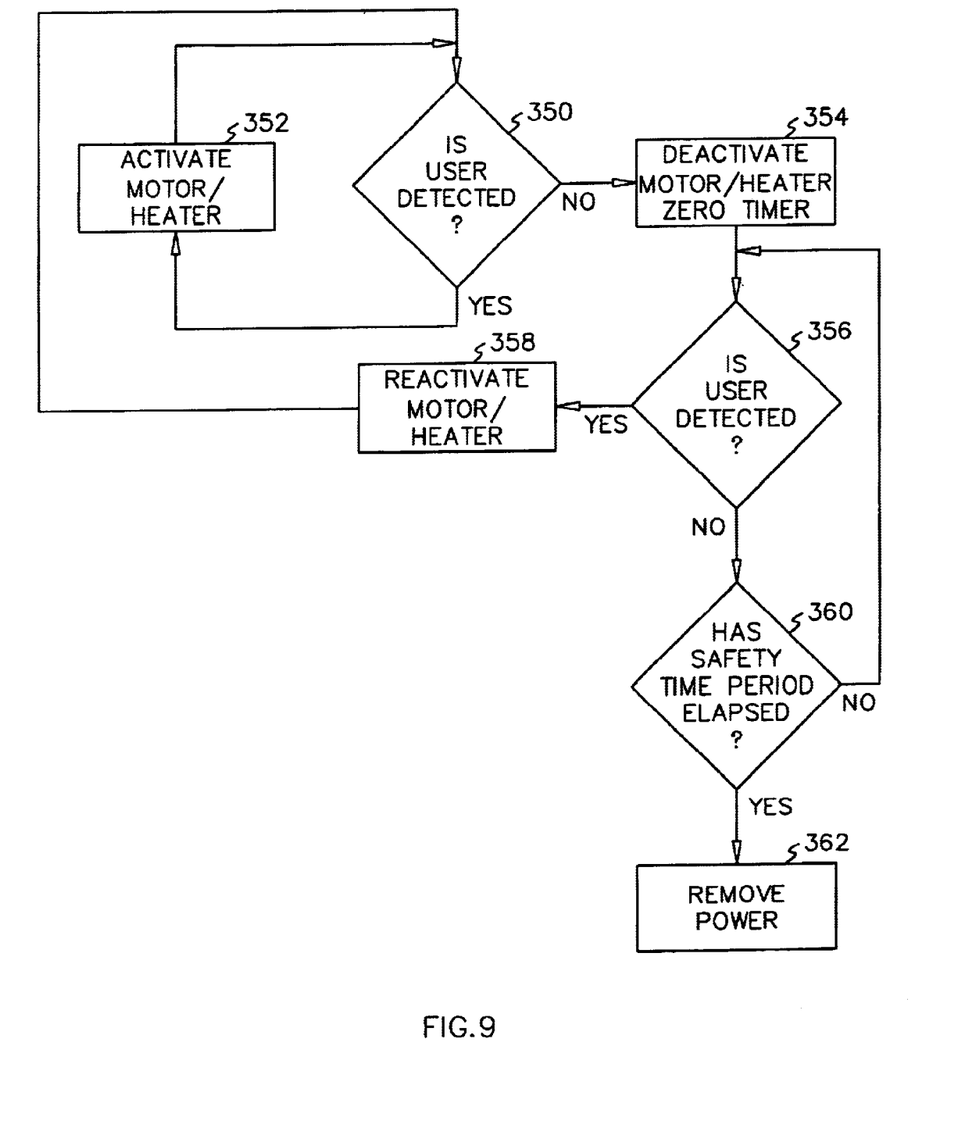
FIG. 9 is a simplified exemplary flow chart of the operation of the safety switch apparatus of the present invention for a second class of embodiments.

FIG. 5 shows a simplified exemplary block diagram of the safety switch apparatus 200 of the present invention for this second class of embodiments as well. The safety switch apparatus 200 is primarily comprised of sensor 108, control circuitry 202, switch circuitry 204, power supply 206, and on/off switch 106. In operation, power is received from AC power plug 208 and once on/off switch 106 is activated, power supply 206 is activated which in turn supplies power to control circuitry 202 (and sensor 108 when an active sensor, e.g., a hall effect sensor, is used) and switch circuitry 204. Control circuitry 202, preferably a microcontroller, FPGA, a custom IC, or the like, preferably operates according to the exemplary flow chart of FIG. 9. Initially as noted in block 350, control circuitry 202 queries sensor 108 via line 210 for the presence of the user either through detection of a depression of the membrane switch 284 or sensing of the detectable material 116, e.g., a magnetic material. If the user is detected, block 352 is executed and control line 212 is enabled to cause switch circuitry 204, typically a semiconductor switch, e.g., a silicon controlled rectifier (SCR), a mechanical relay, e.g., a contactor, or the like, to provide operating power, typically AC, to the motor and/or heater of the dryer 100. When the user releases the handle 274 of the dryer 100, the sensor 108 or membrane switch 284 is no longer activated and in response, control circuitry 202 disables control line 212 in block 354 causing the switch circuitry 204 to remove power from the motor and/or heater (optionally, this determination of whether the motor and/or the heater are involved is made via optional user interface 214). Preferably, the enabling and disabling of the control line 212 is essentially concurrent with the detection and loss of detection of the user either via detection/loss of detection of the detectable material 116 or closure/opening of the membrane switch 284. Accordingly, it is preferable that this response occur promptly, i.e., within a time period of 5 seconds of the detection status change. More preferably, this response occurs immediately, i.e., within a time period of 1 second or less following detection of the detectable material, even more preferably 0.5 seconds or less and most preferably 0.25 seconds or less. Optionally, timer 216, preferably within the control circuitry 202, is zeroed at this step. Preferably in block 356, the control circuitry 202 continues to monitor for the absence of the user. Should the user again be detected, the motor and/or heater is re-activated in block 358 by re-enabling the switch circuitry 204 via control line 212. Optionally, if the user continues to not be detected, block 360 is executed and the timer 216 is compared to a prescribed safety time period, e.g., 5 minutes (optionally, programmable, e.g., to 15 seconds, 30 seconds, 1 minute, 5 minutes, via user interface 214). If the timer 216 has not reached the prescribed limit, the process loops back to block 356. When the prescribed limit is reached, block 362 is executed and power is removed from the control 202 and switch 204 circuitry as well. To enable this optional mode of operation, power supply 206 additionally comprises power maintenance circuitry 218, e.g., a relay or other circuitry, to maintain its power via line 220 upon momentary activation of on/off switch 106a. However, once block 362 is executed this power maintenance circuitry 218 is deactivated. Optionally, the on/off switch 106 is disabled unless the user is detected, e.g., via depression of the membrane switch 284, i.e., unless the handle 274 is gripped.

Furthermore, the detectable, e.g., magnetic, material 116 may be placed within holder 120 (see FIG. 7), e.g., in an upright position, such that placing the dryer within the holder 120 may be detected to thus enable operation of the dryer 100 by placing detectable, e.g., magnetic, material 116 within. Finally, the holder 120 could be configured with the detectable, e.g., magnetic, material 116 in a limited portion or portions of the holder 120 such that in one, e.g., rotational, position, the dryer 100 would be enabled, while in a second, e.g., rotational, position, the dryer would be disabled, e.g., when the sensor 108 approaches a cutout 122 in the holder 120.

Essentially, these classes of embodiments differ in that in this second class of embodiments, it is the continued presence of the user that enables operation of the hand-held apparatus while, conversely, in the first class of embodiments, it is the detection of a condition away from the user, e.g., on a pad of detectable material, that disables operation. Otherwise, the two classes of embodiments use similar hardware and exhibit similar features to the user.

Accordingly, what has been shown is directed to a safety switch system for disabling the operation of a hand-held appliance during periods of nonuse. While the invention has been described by means of specific embodiments and applications thereof, it is understood that numerous modifications and variations could be made thereto by those skilled in the art without departing from the spirit and scope of the invention. For example, while the present invention has been specifically described for use with a hand-held hair dryer, it is recognized that the safety switch system of the present invention will be useful with other hand-held appliances as well. It is therefore to be understood that within the scope of the claims, the invention may be practiced otherwise than as specifically described herein.

What is claimed is:

1. A safety system suitable for use in a hand-held hair dryer wherein said hair dryer comprises a motor and a heater, said system comprising:

a sensor integral to said hand-held hair dryer for detecting presence of an externally-provided magnetic field; and control and switch circuitry for alternatively supplying or removing power to/from said motor and/or heater;

wherein said sensor is coupled to said control circuitry and in response to the absence of a detected externally-provided magnetic field, said control and switch circuitry promptly removes power from said motor and/or heater.

2. The system of claim 1 wherein said control and switch circuitry supplies power to said motor and/or heater when said sensor detects said externally-provided magnetic field.

3. The system of claim 1 wherein after a prescribed period where said externally-provided magnetic field is not detected, operation of the hair dryer ceases.

4. The system of claim 1 wherein said sensor is selected from the group comprising a hall effect sensor, a magnetoresistive sensor, and a reed switch.

5. The system of claim 1 additionally comprising a user wearable structure having a magnetic member contained within for providing said externally-provided magnetic field.

6. The system of claim 5 wherein said user wearable structure is ring-shaped.

7. A safety system suitable for use in a hand-held appliance, said system comprising:

a sensor integral to said hand-held appliance for detecting presence of an externally-provided magnetic field; and control and switch circuitry comprising a first power consuming portion of said hand-held appliance for alternatively supplying or removing power from at least a second power consuming portion of said hand-held appliance;

wherein said sensor is coupled to said control circuitry and in response to the absence of a detected externally-provided magnetic field, said control and switch circuitry promptly removes power from said second power consuming portion of said hand-held appliance.

8. The system of claim 7 wherein said control and switch circuitry supplies power to said second power consuming portion of said hand-held appliance when said sensor detects said externally-provided magnetic field.

9. The system of claim 7 wherein after a prescribed period where said externally-provided magnetic field is not detected, operation of the hand-held appliance ceases.

10. The system of claim 7 wherein said sensor is selected from the group comprising a hall effect sensor, a magnetoresistive sensor, and a reed switch.

11. The system of claim 7 additionally comprising a user wearable structure having a magnetic member contained within for providing said externally-provided magnetic field.

12. The system of claim 11 wherein said user wearable structure is ring-shaped.

13. A safety system suitable for use in an appliance configured to be hand-held by a user, said system comprising:

a sensor for detecting presence of a user;

control and switch circuitry comprising a first power consuming portion of said hand-held appliance for alternatively supplying power to or removing power from at least a second power consuming portion of said hand-held appliance;

a user actuatable switch for activating said control and switch circuitry to enable said circuitry to supply power to said at least second power consuming portion of said hand-held appliance; and herein said sensor is coupled to said control circuitry and in response to said sensor failing to detect the user, said control and switch circuitry promptly removes power from said second power consuming portion of said hand-held appliance.

14. The system of claim 13 wherein said control and switch circuitry supplies power to said second power consuming portion of said hand-held appliance when said sensor detects the user.

15. The system of claim 13 wherein said sensor is a switch that is activated by the user.

16. The system of claim 15 wherein the appliance includes a handle for gripping by the user and said switch is a membrane switch which is positioned within said handle, wherein said membrane switch is activated when the user grips said handle.

17. The system of claim 13 wherein said user actuatable switch is configured for momentary activation to initially activate said control and switch circuitry.

18. The system of claim 17 wherein after a prescribed period where said sensor fails to detect the user, power to said control and switch circuitry is removed and operation of the hand-held appliance ceases.

19. The system of claim 13 wherein in a first position said user actuatable switch is configured to supply power to said control and switch circuitry and in a second position said user actuatable switch is configured to remove power from said control and switch circuitry.

* * * * *

UNITED STATES PATENT AND TRADEMARK OFFICE
CERTIFICATE OF CORRECTION

PATENT NO. : 6,784,775 B2
DATED : August 31, 2004
INVENTOR(S) : Mandell et al.

It is certified that error appears in the above-identified patent and that said Letters Patent is hereby corrected as shown below:

<u>Title page,</u>
Item [60], Related U.S. Application Data, should read as follows:
-- [60] Provisional application No. 60/429,996, filed Nov. 29, 2002. --.

<u>Column 1,</u>
Line 8, to read as follows: -- 60/429,996, filed Nov. 29, 2002, each entitled "Proximity" --.

<u>Column 10,</u>
Line 2, to read as follows: -- hand-held appliance; and wherein --.

Signed and Sealed this

Eighteenth Day of October, 2005

JON W. DUDAS
*Director of the United States Patent and Trademark Office*